United States Patent [19]

Baum et al.

[11] Patent Number: 5,096,737

[45] Date of Patent: Mar. 17, 1992

[54] LIGAND STABILIZED +1 METAL BETA-DIKETONATE COORDINATION COMPLEXES AND THEIR USE IN CHEMICAL VAPOR DEPOSITION OF METAL THIN FILMS

[75] Inventors: Thomas H. Baum; Carl E. Larson, both of San Jose, Calif.; Scott K. Reynolds, Yorktown Heights, N.Y.

[73] Assignee: International Business Machine Corp., Armonk, N.Y.

[21] Appl. No.: 602,970

[22] Filed: Oct. 24, 1990

[51] Int. Cl.$^5$ .......................... B05D 3/06; B05D 5/12; C23C 16/06

[52] U.S. Cl. ..................... 427/38; 427/53.1; 427/54.1; 427/125; 427/123; 427/124; 427/248.1; 427/250; 427/314

[58] Field of Search ............... 427/125, 39, 53.1, 54.1, 427/38, 250, 314, 248.1, 123, 124

[56] References Cited

U.S. PATENT DOCUMENTS

| | | | |
|---|---|---|---|
| 3,356,527 | 12/1967 | Moshier et al. | 117/107.2 |
| 3,438,805 | 4/1969 | Potrafke | 117/130 |
| 3,625,765 | 12/1971 | Potrafke | 117/160 |
| 3,700,693 | 10/1972 | Cairncross et al. | 260/340.6 |
| 3,817,784 | 6/1974 | Cairncross et al. | 117/227 |
| 3,933,878 | 1/1976 | Ttyler et al. | 260/438.1 |
| 4,385,005 | 5/1983 | Doyle | 260/464 |
| 4,425,281 | 1/1984 | Doyle | 260/430 |
| 4,842,891 | 6/1991 | Miyazaki et al. | 427/35 |
| 5,019,531 | 5/1991 | Awaya | 437/180 |

FOREIGN PATENT DOCUMENTS

| | | |
|---|---|---|
| 145054 | 7/1949 | Australia . |
| 0070638 | 7/1982 | European Pat. Off. . |
| 0297348 | 6/1988 | European Pat. Off. . |

OTHER PUBLICATIONS

Appl. Phys. A 45, 151-154 (1988) Thin Copper Films by Plasma CVD Using Copper-Hexafluoro-Acetylacetonate by C. Oehr and H. Suhr.
Appl. Phys. Lett 46 (2), 15 Jan. 1985—Laser Chemical Vapor Deposition of Copper by F. A. Houle, C. R. Jones, T. Baum, C. Pico and C. A. Kovac.

Primary Examiner—Shrive Beck
Assistant Examiner—Roy V. King
Attorney, Agent, or Firm—John A. Stemwedel

[57] ABSTRACT

Chemical vapor deposition precursors for depositing copper, silver, rhodium and iridium metals on substrates comprise ligand stabilized +1 metal beta-diketonate coordination complexes of said metals. Uses of such precursors in CVD processes are also provided.

12 Claims, No Drawings

LIGAND STABILIZED +1 METAL BETA-DIKETONATE COORDINATION COMPLEXES AND THEIR USE IN CHEMICAL VAPOR DEPOSITION OF METAL THIN FILMS

FIELD OF INVENTION

This invention relates to chemical vapor deposition (CVD) of high purity metals (viz., copper, silver, rhodium, and iridium) from (+1) oxidation state metal precursors selected from Cu(I), Ag(I), Rh(I) and Ir(I) ligand stabilized coordination complexes wherein the (+1) metal is coordinated to a beta-diketone. The precursor complexes are usually air stable and form high quality metal films at low temperatures using either thermal or laser induced chemical vapor deposition processes.

BACKGROUND ART

Metal complexes have been used in many plating schemes. Among the complexes are metal, salt/phosphine complexes derived from a nonorganometallic salt of a heavy metal and a triorganophosphine as disclosed in U.S. Pat. Nos. 3,438,805 and 3,625,755. Such complexes are useful in chemical or electroless plating.

U.S. Pat. Nos. 3,700,693 and 3,817,784 are directed to the preparation of certain fluoroorganocopper compounds which are soluble in aprotic solvents and which are useful as coating compositions that are to be adhered to substrates and subsequently thermally decomposed.

U.S. Pat. No. 3,933,878 is directed to Cu(I) plating solutions which may be triorganophosphine complexes with Cu(I) salts.

Australian Patent No. 145,054 discloses compositions for chemical or electroless plating of copper, silver, gold, and other metals from a bath containing a salt of the metal and 2,4-pentanedione.

European Published Patent application No. 0297348 is directed to methods for chemical vapor deposition of copper, silver, and gold using certain cyclopentadienyl metal complexes.

U.S. Pat. No. 3,356,527 is directed to the use of trifluoro- and hexafluoroacetylacetonates of Metal(II) hydrates, halides, alkyl, aryl, hydroxyl and nitro-compounds (e.g., copper(II), nickel, cobalt(II), and lead) in chemical vapor deposition processes. Such processes require the use of a carrier/reducing gas, namely, hydrogen, hydrazine, carbon monoxide or the like.

Oehr and Suhr, Appl. Phys. A45,151–54(1988) discloses the preparation and use of copper(II), bis-hexafluoroacetylacetonate in the chemical vapor deposition of thin copper films. The process requires the use of hydrogen gas in order to obtain metal films deposited.

Houle et al., Appl. Phys. Lett. 46, Jan 1985 204 et seq., describes laser induced chemical vapor deposition of copper using a volatile copper coordination complex. The source of copper for these studies was bis-(1,1,1,5,5,5-hexafluoro-2,4-pentanedionate) copper(II).

Thermal CVD of copper has also been reported from other precursors such as copper chloride ($CuCl_2$) and copper acetylacetonates ($Cu(C_5H_7O_2)_2$). The copper chloride system requires the addition of hydrogen as a reducing agent and operates at temperatures of 400–1200° C. The products of the reaction are copper and hydrogen chloride (HCl), and a reasonable mechanism for this reaction probably involves disassociative chemisorption of both reactants followed by a surface reaction to make HCl which then desorbs. When copper is deposited from copper(II) bisacetylacetonate, such process may or may not include hydrogen reactants or carrier gases. Generally deposition of copper from these sources results in copper films of lower quality (i.e., lower purity, higher resistivity).

While the prior art generally recognizes the desirability of chemical vapor deposition of metals such as copper, precursors and techniques previously tried have not been successful for the reasons such as those set forth as above. In particular, the prior techniques require either unrealistically high processing temperatures or produce films which are contaminated with carbon and/or oxygen. The use of the chloride precursors in particular has required high processing temperatures while the use of acetylacetonate precursors has led to the deposition of films with high levels of carbon and/or oxygen.

Accordingly, it is a primary object of the present invention to provide an improved technique for CVD of copper and other +1 oxidation state metals wherein films of high quality can be deposited at relatively low temperatures.

It is another object of this invention to provide improved CVD processes for the deposition of Cu, Ag, Rh and Ir films of high quality and good surface morphology.

Low temperature requirements for the deposition of transition metals are most easily met by the decomposition of organometallic precursors. However, for certain metals such as copper, this is made difficult by the instability of organocopper compounds and their tendency to form nonvolatile oligomers and polymers. For example, binary alkyl copper complexes undergo autocatalytic decomposition to alkanes or alkenes and copper metal at temperatures too low for the compounds to be practically useful. This instability decreases the concentration of precursor that reacts at the heated substrate and large amounts of reactants will be lost. In the case of binary aryl copper complexes, these materials are more stable, but their oligomeric structure lowers their volatility to the point that decomposition occurs before transport. Again, this means that insufficient quantities of reactants will be delivered to the substrate during metal film growth.

It is another object of this invention to provide a class of precursor compounds which can be used in low temperature thermal and laser induced chemical vapor deposition processes without the problems described in the previous paragraph.

The invention broadly relates to the use of certain (+1) metal coordination complexes for the CVD of substantially pure metal, such as copper, silver, rhodium, or iridium, onto a substrate where the process is a thermally driven or laser induced CVD process. In the course of such process, the oxidation state of the metal goes to (0). The high quality metal complexes include a central metal atom in the (+1) oxidation state such as Cu(I), Ag(I), Rh(I) and Ir(I). Generally, the substrate upon which deposition is desired is heated in order to provide an activated or energized site for the decomposition reaction to occur. In the practice of the present invention, any type of CVD apparatus in which the substrate is heated and/or in which the gaseous precursor is heated in the immediate vicinity of the target substrate may be used with the precursors of the invention. These apparatus include standard thermal reactors, such as cold wall, hot substrate reactors, as well as laser or radiation beam reactors where a laser beam is used to heat the substrate and/or the precursor in the vicinity of the substrate. In the art, it is common to refer to these apparatus and the processes separately so that thermal CVD implies the use of a thermal reactor and laser CVD implies the use of a laser energy source. However, in laser CVD, the laser may provide energy in the ultraviolet wavelength region to alter the mode of precursor decomposition (i.e., electronic wavelength excitation). A laser or plasma may also be used separately or in conjunction with the thermal CVD techniques.

In a suitable thermal CVD process, the reaction vessel is usually a cold wall, hot substrate apparatus in which vapors of the precursor metal complex travel to the heated substrate and decompose on its surface resulting in a pure metal deposit. There is insufficient thermal activation in other regions of the reactor to facilitate any significant decomposition and/or deposition where it is not desired.

In laser induced CVD processes, laser energy may heat the substrate or it may be focused so as to cause the decomposition of the precursor gas in the immediate vicinity of the substrate. The precursor complexes may be such that they do not absorb laser energy in the vapor phase, but decompose on a laser heated substrate or they may be such that they absorb focused laser energy and dissociate on a nearby substrate before they can recombine or be deactivated in the gas-phase.

The deposition techniques of this invention are based upon the discovery that certain stabilized metal coordination compounds are particularly useful in thermal, plasma and laser-induced CVD as precursors for deposition of copper, silver, rhodium and iridium metals. These complexes are all in the (+1) oxidation state. It has been found that the quality of the films deposited is much improved over the films formed from precursors having a (+2) oxidation state as may be found in the prior art, especially for copper.

For metal deposition in accordance with the present invention, unique precursor complexes have been discovered. These complexes comprise a metal in the (+1) oxidation state coordinated to a beta-diketone and provided with one or more stabilizing ligands. In some instances such stabilizing ligands may be shared by more than one coordination complex. The preferred (+1) metal is selected from the group consisting of Cu(I), Ag(I), Rh(I) and Ir(I). The metal complexes of greatest commercial importance are Cu(I) and Ag(I).

The beta-diketone which is believed to form a 6-membered coordinated ring with the metal is of the form R'COCHRCOR" where CO is carbonyl, where R is H, methyl, ethyl or halogen, and where R' and R" may be the same or different and are selected from the group consisting of $C_nH_{(2n+1)}$, $C_nF_{(2n+1)}$, aryl and substituted aryl where n is an integer from 1 to 4. Typical of the substituent groups included in R' and R" are —$CH_3$, —$CF_3$, —$C_2H_5$, —$C_2F_5$, —$C_3H_7$, —$C_3F_7$, —$C_4H_9$ and —$C_4F_9$. The most preferred beta-diketones are acetylacetone (acac), trifluoroacetylacetone (tfacac) and hexafluoroacetylacetone (hfacac).

The stabilizing ligands include alkynes, olefins, dienes, and phosphines and may broadly include alkyl, trifluoroalkyl and halogen substituted ligands. Included in the stabilizing ligands are 1,5-cyclooctadiene (COD), fluoro-1,5-cyclooctadiene, methyl-1,5-cyclooctadiene, dimethyl-1,5-cyclooctadiene, cyclooctene (COE), methylcyclooctene, cyclooctatetraene (COT), substituted cyclooctatetraene, norbornene, norbornadiene, tricyclo[5.2.1.0]-deca-2,6-diene, alkyl-substituted tricyclo-[5.2.1.0]-deca-2,6-diene, 1,4-cyclohexadiene, acetylene, alkyl or halogen substituted acetylenes, carbon monoxide, [4.3.0]bicyclo-nona-3,7-diene and substituted [4.3.0]bicyclo-nona-3,7-dienes, amines and substituted amines, trimethyl phosphines and substituted phosphines. It is believed that the ligands impact stability to the complexed metal (I) structure by pi bonding overlap with the metal p and d orbitals. The metal may impart back bonding to the stabilizing ligand(s) as well.

It is believed that there is a very intricate relation wherein the stabilizing ligands bond to the metal center by pi overlap with the p and d orbitals of the metal. They add stability by occupying coordination sites and through pi bond or back-bonding with the metal. Copper(I) can form both trigonal and square planar coordination complexes. Thus, when COE complexes are formed, the coordination number may be 3 and the structure is trigonal. On the other hand where COD is used, the coordination number is 4 and the structure is most likely square planar. For this reason, we do not rely on any premise that favors one shape or structure over any other, but take the position that stabilization occurs when all of the permitted coordinating sites are filled with the respective ligands.

The vertical film growth achieved via CVD methods enables the filling of high-aspect ratio holes or structures. The CVD process affords conformal growth and the potential to completely fill (without the presence of voids) vias, holes and channels with nearly vertical sidewalls. Thus far, vias, holes or channels with an aspect ratio of 2.6 to 1 have been filled by this CVD process and possess only a seam, analogous to that found for blanket tungsten CVD processes. The use of (COD)Cu(I)(hfacac) and (DMCOD)Cu(I)(hfacac) for the CVD of copper films has demonstrated superior conformality, surface smoothness and vertical hole-filling. The ability to completely fill vertical holes or vias enables the fabrication of multi-layered structures with interconnection from a top layer to those underlying metallurgical layers. The following examples are illustrative of the invention.

EXAMPLE 1

A 1,5-cyclooctadiene copper(I) hexafluoroacetylacetonate coordination complex (COD)Cu(hfacac) was prepared in accordance with the improved literature method. Doyle et al., *Organometallics*, 4,830 (1985). This complex was purified by recrystallization and was obtained as bright yellow crystallization and was obtained as the complex was achieved by CVD between 150 and 300° C. substrate temperature. The deposition of copper was achieved on silicon, onto various metals (Au, Cu, Ti, Cr), and onto various insulatprs ($SIO_2$, TiN, ceramics and polymers, such as polyimide). The deposited copper was found to be of 95-98% atomic purity by Auger analysis after sputtering to a depth of 200 Angstroms. Under identcal analytical conditions, an evaporated copper on silicon standard was found to be 95% atomic purity. The electrical properties of the thin copper films include a resistivity of between 1.8 and 2.5 microohms-cm. A high purity copper film was grown on a substrate at a temperature of 190° to 200° C. with a growth rate of 200 to 250 Angstrom/min.

EXAMPLE 2

Synthesis of bis-and tris-(trimethylphosphino) copper(I)hexafluoroacetylacetonates were achieved by modifications of the literature methods. The tris-complex was easily prepared in high yield, isolated with good purity, sublimes as a white crystalline solid between 45° and 50° C., and was quite stable in air. The bis-complex, on the other hand, is a slightly air sensitive liquid. Thermal decomposition of either bis or tris(-trimethylphospino) copper(I) hexafluoroacetylacetonate was demonstrated by laser induced CVD onto a ceramic substrate. The 514 nm line of an argon ion laser was focused to roughly a 10 micron diameter spot. Laser induced pyrolytic deposition was achieved and the resistance of the deposited copper was measured by four point probe. The calculated resistivity was found to be roughly 5 times that of bulk copper (1.67 microhms-cm for lines 1 micron or greater in thickness). The vertical growth rate was estimated to be 1 micron/scan with a scan velocity of 3 micron/sec with the precursor heated to 50° C.

EXAMPLE 3

The deposition of silver films was achieved by thermal CVD from (COD)Ag(I)(hfacac). This precursor was prepared according to the literature (i.e. Doyle et al., *Organometallics*, 4, 830 (1985) and was a white crystalline solid. The solid was transported to the heated substrate (250° C.) by heating the source vessel to 60° C. with a carrier gas flow (i.e. hydrogen, helium). The resulting film was shiny, of high purity ($\geq 95\%$) and good electrical resistance.

EXAMPLE 4

The deposition of rhodium metal was achieved by thermal CVD from (COD)Rh(I)(hfacac). This precursor was synthesized by reacting CODRhCl dimer with potassium hfacac and isolated as a bright orange crystalline solid. The material was purified by recrystallization or sublimation under vacuum. The solid was transported to the heated substrate (250- 350° C.) by heating the source vessel with a carrier gas flow (i.e. hydrogen, helium). The resulting film had a shiny, metallic appearance and was of high purity (95%).

The following examples show the improved hole and trench filling achieved by the invention.

EXAMPLE 5

CVD experiments for (COD)Cu(I)(hfacac) were performed in a vertical cold-walled reactor in which the source vapor flows over a heated perpendicular substrate. The substrate to be metallized is heated from the backside by either optical or resistive heating methods. The source material, (COD)Cu(I)(hfacac), is held in a heated vessel at 62° C. and carrier gas flows through the powder to aid in transport of the reactant. Typical chamber pressures during deposition are about 100 millitorr (source plus carrier gas) and total flows between 50 to 100 sccm are used. The entire source delivery system is heated to 70° C. to prevent condensation of the reactant on the reactor walls.

The growth rate of Cu films varies with process conditions such as the precursor partial pressure, the substrate temperature, the carrier gas flow rate and the total reactor chamber pressure. A careful control of each variable must be maintained for reproducible growth rates. Conformality and vertical channel filling have been investigated as a function of process conditions. The optimum conformality and vertical filling was observed at low substrate temperatures and high partial pressures of (COD)Cu(I)(hfacac). High aspect ratio hole filing has been observed under optimized process conditions and exhibits a minimal center seam comparable to that observed for blanket CVD tungsten from $WF_6$ Under mass-transport limited conditions, substrate temperature of 225° C. and (COD)Cu(I)(hfacac), partial pressure of 40 millitorr, poor conformality and hole filling is observed.

Resistivity of Cu films depends primarily on the substrate temperature and rate of film growth. Under optimized conditions for hole filling, the copper film resistivity is 2.0 microhm-centimeter or lower. The best resistivity achieved is 1.88 microhm-centimeter with (COD)Cu(I)(hfacac).

EXAMPLE 6

Chemical vapor deposition (CVD) of high purity copper films from (DMCOD)Cu(I)(hfacac) have been achieved. The (DMCOD) Cu(I)(hfacac) complex, it should be noted, is a mixture of 1,5dimethyl-1,5-cyclooctadiene(80%) and 1,6dimethyl-1,5-cyclooctadiene(20%) stabilizing ligands used to form the copper complex.

The (DMCOD) Cu(I)(hfacac) precursor was held in a heated source bubbler (50 to 70° C.) and carrier gas was used to aid the transport of the reactant to the heated substrate. The carrier gas ($H_2$ or He) flow was 20 to 40 sccm and the total chamber pressure was several hundred mTorr (i.e. 300–700 mTorr). The walls of the chamber were heated from 70 to 75° C. to prevent condensation of the reactant on the reactor walls. For a given substrate and source vessel temperature, (COD)-Cu(I)(hfacac) provides a higher deposition rate, when compared to (COD)Cu(I)(hfacac), and reflects the higher volatility and lower decomposition temperature of this precursor. The ability to form high purity films of copper at a substrate temperature of 180° C. and still reserve good resistivity and grain structure was noted. Easy vertical filling of structures was observed with growth rates of 350 to 400 Angstrom/min and resistives of 1.9 to 2.3 microohms-cm. Under these conditions, the conformal growth of copper from via or trench sidewalls was observed and resulted in the filling of structures without voids. Higher deposition rates have been achieved at higher substrate temperatures, but the degree of conformality is sacrificed. However, a greater process latitude was noted for (DMCOD)Cu(I)(hfacac) with respect to precursor partial pressure, carrier gas flow, substrate temperature and ease of vertical filling of structures.

While the preferred embodiments of the present invention are described above, many potential modifications which fall within the generic concept of the invention will occur to those skilled in the art upon a reading of the present specification. Such modifications in terms of metal (+1) atom, coordinating beta-diketone and stabilizing ligands are within the teaching of the present invention and within its scope as set forth in the claims which follow.

What is claimed is:

1. A method for chemical vapor deposition of a metal selected from the group consisting of copper, silver, rhodium and iridium from a ligand stabilized (+1) coordination complex of said metal comprising the steps of (a) heating a substrate onto which deposition of said metal is to occur, said substrate being located in a deposition chamber, (b) producing a vapor consisting essectially of a precursor cohtaining said metal in said chamber in the vicinity of said substrate, said precursor comprising a beta-diketone coordinated to said metal and at least one stabilizing ligand bonded to said metal, said metal to be deposited being in the (+1) oxidation state, and (c) decomposing said vapor to deposit said metal on said substrate in the (0) oxidation state.

2. The method of claim 1 which comprises a thermal heating means.

3. The method of claim 1 which comprises a laser induced heating means.

4. The method in claim 1 which comprises a laser induced decomposition of said compounds via ultraviolet wavelengths of light.

5. The method of claim 1 which comprises the use of a plasma method.

6. The method of claim 1 wherein the beta-diketone has the formula R'COCHRCOR" where R is —H, methyl, ethyl, or halogen, and where R' and R" are selected from the group consisting of $C_nH_{(2n+1)}$, $C_nF_{(2n+1)}$, aryl and substitited aryl where n is an integer from 1 to 4.

7. The method of claim 1 wherein the beta-diketone is selected from acetylacetone, trifluoroacetylacetone and hexafluoroacetylacetone.

8. The method of claim 1 wherein the stabilizing ligand is selected fron the group consisting of substituted and unsubstituted aklynes, olefins, dienes and phosphines.

9. The method of claim 1 wherein the precursor is 1,5-cyclooctadiene copper(I) hexafluoroacetylacetonate or dimethyl 1,5-cyclooctadiene copper (I) hexafluoroacetylacetonate.

10. The method of claim 6 wherein R is H and R' and R" are selected from the group consisting of —CH₃, —CF₃, —C₂H₅, —C₂F₅, —C₃H₇&ᵢ, —C₃F₇, —C₄H₉ and —C₄F₉.

11. The method of claim 8 wherein the stabilizing ligand is selected from the group consisting of 1,5-cyclooctadiene, fluoro-1,5-cyclooctadiene, cyclooctene, methylcyclooctene, cyclooctatetraene, norbornene, norbornadiene, tricyclo[5.2.1.0]-deca-2,6-diene, alkyl-substituted tricyclo[5.2.1.0]-deca-2,6-diene, 1,4-cyclohexadiene, acetylene, alkyl-substituted acetylene, halogen-substituted acetylene and trimethyl phosphine.

12. The method of claim 11 wherein the dimethyl 1,5-cyclooctadiene copper(I) hexafluoroacetylacetonate is selected from the group consisting of 1,5-dimethyl 1,5-cyclooctadiene copper(I) hexafluoroacetylacetonate, 1,6-dimethyl 1,5-cyclooctadiene copper(I) hexafluoroacetylacetonate, and other substituted 1,5-cyclooctadiens and mixtures thereof.

* * * * *